US010529687B2

(12) United States Patent
Wang

(10) Patent No.: US 10,529,687 B2
(45) Date of Patent: Jan. 7, 2020

(54) STACKED PHOTODETECTORS COMPRISING A CONTROLLER TO APPLY A VOLTAGE TO A PHOTODETECTOR STRUCTURE BASED ON A LIGHTING CONDITION

(71) Applicant: HEWLETT-PACKARD DEVELOPMENT COMPANY, L.P., Houston, TX (US)

(72) Inventor: Michael D X Wang, Palo Alto, CA (US)

(73) Assignee: Hewlett-Packard Development Company, L.P., Spring, TX (US)

(*) Notice: Subject to any disclaimer, the term of this patent is extended or adjusted under 35 U.S.C. 154(b) by 37 days.

(21) Appl. No.: 15/542,864

(22) PCT Filed: Apr. 24, 2015

(86) PCT No.: PCT/US2015/027656
§ 371 (c)(1),
(2) Date: Jul. 11, 2017

(87) PCT Pub. No.: WO2016/171733
PCT Pub. Date: Oct. 27, 2016

(65) Prior Publication Data
US 2018/0033769 A1 Feb. 1, 2018

(51) Int. Cl.
H01L 25/04 (2014.01)
G01J 1/42 (2006.01)
(Continued)

(52) U.S. Cl.
CPC .......... H01L 25/043 (2013.01); G01J 1/4204 (2013.01); H01L 27/14652 (2013.01); H04N 5/332 (2013.01); H04N 5/374 (2013.01)

(58) Field of Classification Search
CPC ............. H01L 27/14645; H01L 25/043; H01L 27/14652; H01L 27/14647; H04N 5/332;
(Continued)

(56) References Cited

U.S. PATENT DOCUMENTS 4,677,289 A * 6/1987 Nozaki .................... G01J 1/18
250/208.2
5,965,875 A * 10/1999 Merrill .............. H01L 27/14623
250/208.1
(Continued)

FOREIGN PATENT DOCUMENTS

JP 2006049437 A 2/2006
KR 10-2007-0000131 A 1/2007
(Continued)

OTHER PUBLICATIONS

Langfelder, G., et al.; "A Device and an Algorithm for the Separation of Visible and Near Infrared Signals in a Monolithic Silicon Sensor"; Feb. 3, 2011; 9 pages.
(Continued)

Primary Examiner — Que Tan Le
(74) Attorney, Agent, or Firm — HPI Patent Department

(57) ABSTRACT

In examples provided herein, an optical fiber distribution node stacked photodetector can include a stack of photodetector structures. The photodetector structures are arranged in positions in the stack corresponding to penetration depths associated with corresponding wavelength ranges. The stacked photodetector can also include a controller coupled to the stack of photodetector structures to determine photoelectric signals corresponding to light intensity of the wavelength ranges in light incident on the stack of photodetector structures.

15 Claims, 8 Drawing Sheets

(51) Int. Cl.
*H01L 27/146* (2006.01)
*H04N 5/33* (2006.01)
*H04N 5/374* (2011.01)

(58) Field of Classification Search
CPC . H04N 2209/047; H04N 5/374; G01J 1/4204; G01J 3/51
USPC .............................................. 250/214.1, 239
See application file for complete search history.

(56) References Cited

U.S. PATENT DOCUMENTS

| | | |
|---|---|---|
| 6,198,147 B1 | 3/2001 | Connolly |
| 8,659,698 B2 | 2/2014 | Blayvas et al. |
| 2004/0125222 A1 | 7/2004 | Bradski |
| 2010/0026192 A1 | 2/2010 | Hadwen et al. |
| 2015/0062347 A1 | 3/2015 | Jin |

FOREIGN PATENT DOCUMENTS

| | | |
|---|---|---|
| KR | 10-0723457 B1 | 5/2007 |
| WO | WO-2014204111 | 12/2014 |

OTHER PUBLICATIONS

Swaminathan, et al; "Optically-aligned Visible/near-infrared Dual-band Photodetector Materials and Devices on GaAs Using Metamorphic Epitaxy" Sep. 23, 2011; 9 pages.

* cited by examiner

STACKED PHOTODETECTORS COMPRISING A CONTROLLER TO APPLY A VOLTAGE TO A PHOTODETECTOR STRUCTURE BASED ON A LIGHTING CONDITION

BACKGROUND

The efficacy of imaging and display devices to detect, reproduce, or depict colors accurately for human viewers is dependent on the spectral content of the lighting conditions. A spectral content curve that represents the wavelength content of light can be obtained by making measurements of the intensity or power of the light as a function of wavelength. The absolute power information of the spectral content curve can be converted to photometric information by applying a photometric function that models human visual responses to various wavelengths. The radiometric or photometric information can be used to inform the operation of the imaging devices to capture or the display devices to display images with accurate color representations or brightness for specific lighting conditions.

DETAILED DESCRIPTION

The present disclosure describes techniques for systems, methods, and devices that include vertically stacked photodetectors. Such vertically stacked photodetectors can be used in various general purpose and specialized computing devices (e.g., desktop computers, laptop computers, tablet computers, smartphones, thermal imagers, etc.) to measure and characterize ambient light. Vertically stacked photodetectors can simultaneously capture spectrographic and radiometric measurements of lighting conditions. Such measurements can be used to inform the operation of imaging and display devices associated with the computing device. For example, a mobile computing devices can use the radiometric or spectrometric measurements from a vertically stacked photodetector to generate operational settings for an integrated camera module to capture color images with accurate color representation. Similarly, the mobile computing device can use the vertically stacked photodetector to derive photometric settings for the operation of a display or touchscreen to render color images accurately in a particular lighting scenario.

Various implementations of the present disclosure can include a stack of multiple photodetector devices disposed at various depths from an input surface of the stack. The position of a particular photodetector in the stack can correspond to the penetration depth of a particular wavelength or range of wavelengths. Accordingly, a photodetector at a particular penetration depth can be used to detect light having a particular wavelength. The resolution of the measurements (e.g., the granularity of the light intensity measurements as a function wavelength bands) can be determined by the number of photodetectors in the stack, as well as the type, dimensions (e.g., thickness), and operational settings of the photodetectors.

The term "penetration depth" is used herein to refer to the distance, or range of distances, a photon having a particular energy will travel through a material, such as a semiconductor material, before causing an electron to be emitted (e.g., the photoelectric effect). In photodetectors, such as photodiodes, the emitted electrons can be collected to cause a photoelectric current or voltage having a particular magnitude. The magnitude of the photoelectric current or voltage from a particular photodetector corresponds to the intensity of the wavelength of light detected at the corresponding penetration depth. As such, in a stack of photodetectors according to the present disclosure, the intensity of various individual wavelengths or bands of wavelengths in incident light can be measured simultaneously using a single stack of photodetectors without optical filters or color separating optics (e.g., diffractions gratings, prisms, etc.).

Figure 1:
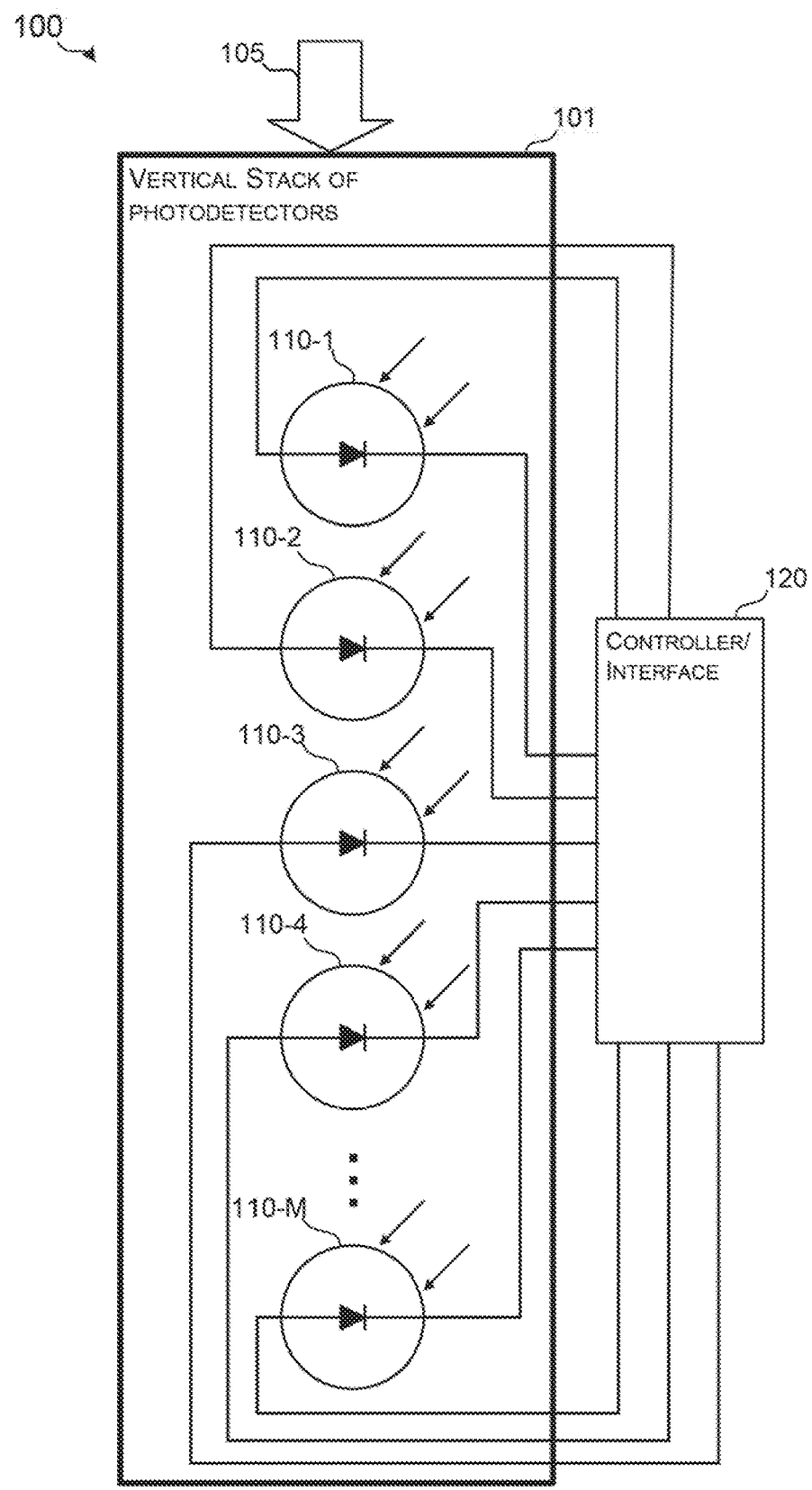
FIG. 1 depicts a schematic diagram of an example stacked photodetector module.

FIG. 1 is a schematic of a stacked photodetector module 100, according to various implementations of the present disclosure. As shown, the stacked photodetector module 100 can include a vertical stack of photodetectors 101 coupled to a controller/interface 120. The vertical stack of photodetectors 101 can include multiple photodetector structures, such as photodiode structures 110. The controller/interface 120 can include any combination of hardware, firmware, or executable code to implement the functionality described herein. In some implementations, the controller/interface 120 can include logic in the form analog and/or digital logic circuitry. As such, controller/interface 120 can be included in an IC chip coupled to the stack of photodetectors 101.

In the example implementation depicted in FIG. 1, the vertical stack of photodetectors 101 includes M photodiode structures 110, where M is a natural number. In such implementations, each of the photodiode structures 110 can include a doped semiconductor device that can be biased to generate a photoelectric current or voltage corresponding to a particular band of wavelengths when exposed to light 105. In such implementations, the controller/interface 120 can apply corresponding bias voltages to the photodiode structures 110.

In some implementations, the controller/interface 120 can apply the same bias voltage to all of the photodiode structures 110. In other implementations, the controller/interface 120 can apply independent individual bias voltages to each of the photodiode structures 110. For example, the controller/interface 120, or other components of a computing device coupled to, the vertical stack, of photodetectors 101, can apply a corresponding bias voltage specific to each of the individual photodiode structures 110. Either the common bias voltage and/or the photodiode-specific bias voltage can be based on a calibration of the vertical stack of photodetectors 101. A corresponding calibration file can be stored in a memory (e.g., a volatile or nonvolatile memory) included in the controller/interface 120 or another component of the computing device in which the stacked photodetector module 100 is included.

The calibration file can include multiple sets of operational settings that the controller/interface 120 can use to operate the photodiode structures 110 in corresponding specific modes of operation. For example, one set of operational settings can include bias voltage settings that can be used for bright light conditions, while another set of operational settings can include bias voltage settings that can be used for low light conditions. Similarly, the operational settings can include sets of bias voltage settings for lighting conditions that change rapidly over time (e.g., bias voltage settings that can be used with short integration times), as well as sets of bias voltage settings for lighting conditions that are relatively constant (e.g., bias voltage settings that can be used with long integration times).

As depicted in FIG. 1, the photodiode structures 110 of the vertical stack of photodetectors 101 can be disposed in a stack that has a top and a bottom. In the example illustrated, the photodiode structure 110-1 is at the top of the stack while the photodiode structure 110-M is at the bottom of the stack. Each of the other photodiode structures 110 are disposed in a position between the top and bottom of the stack. Photo diode structures 110 disposed closer to photodiode structure 110-M (e.g., photodiode structure 110-4) are referred to as being deeper in the vertical stack of photodetectors 101 than the photodiode structures 110 closer to the photodiode structure 110-1 (e.g., photodiode structures 110-2 and 110-3). Accordingly, the top photodiode structure 110-1 is referred to as being on or at the input surface of the vertical stack of photodetectors 101.

The controller/interface 120 can detect, read-out, and/or record photoelectric signals (e.g., photoelectric voltages or photoelectric currents) from the individual photodiode structures 110 to determine the intensity of light detected at the corresponding depths in the vertical stack of photodetectors 101. The control/interface 120 can also include and/or use calibration information to determine to which wavelengths or wavelength bands the photoelectric signals correspond. For example, calibration information available to the controller/interface 120 can indicate that the top most photodiode structure 110-1 is at a depth corresponding to the penetration depth of blue light, photodiode structure 110-2 is at a depth corresponding to the penetration depth of dark green light, photodiode structure 110-3 is that a depth corresponding to the penetration depth of yellow light, photodiode structure 110-4 is at a depth corresponding to the penetration depth of red light, and photodiode structure 110-M is at a depth corresponding to the penetration depth of infrared light. While the penetration depths of various wavelength bands are described above generally in terms of color, in various implementations, the width of the wavelength bands can be defined in terms of specific ranges of wavelengths or frequencies of light.

In various implementations, the controller/interface 120 can include logic or other functionality for outputting photometric or spectral content curves based on the photoelectric signals received from at least one of the photodiode structures 110. The controller/interface 120 can also include logic and/or functionality for generating a composite total brightness signal based on the photoelectric signals and/or the photometric or spectral content curves associated with the photodiode structures 110 in the vertical stack of photodetectors 101.

Figure 2:
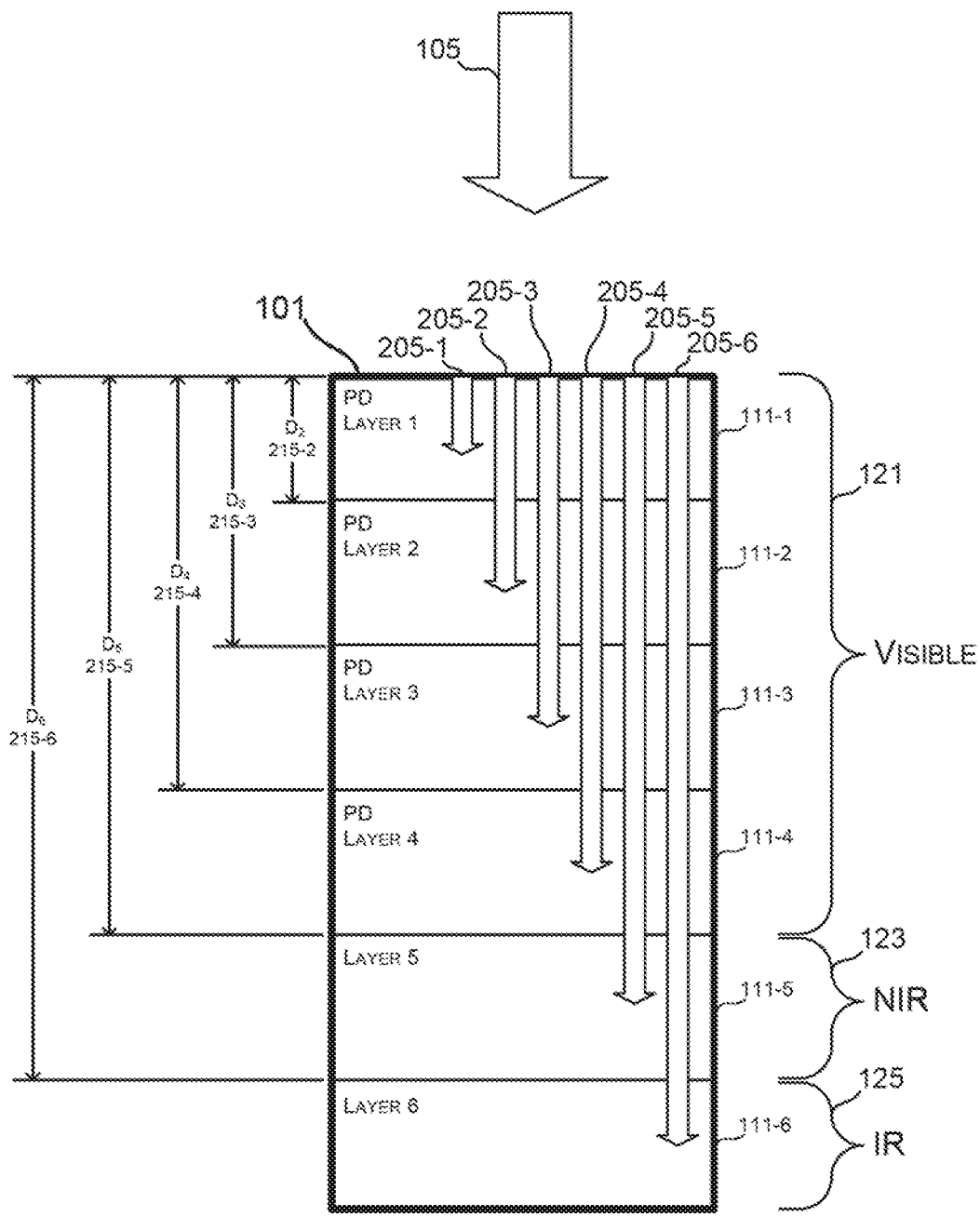
FIG. 2 illustrates an example stack of photodetectors and corresponding wavelength dependent penetration depths.

FIG. 2 depicts vertical stack of photodetectors 101 according to various implementations of the present disclosure. In the example shown, the photodetector layers 111 can correspond to the photodiode structures 110 of FIG. 1 or other photosensitive devices. As shown, the depth D 215 and thickness of each photodetector layer 111 can correspond to a particular penetration depth 205 of a corresponding band of wavelengths of incident light 105.

In the particular example shown, photodetector layer has a depth of zero because the topmost surface photodetector layer is also the input surface for receiving incident, light 105. Accordingly, component wavelengths of light in incident light 105 with a penetration depth 205-1 in the material of stack of photodetectors 101 between zero and depth $D_2$ (reference 215-2) can be detected in photodetector layer 111-1. Component wavelengths of light with a penetration depth of 205-2 between $D_2$ and $D_3$ (references 215-2 and 215-3) can be detected in the photodetector layer 111-2. Component wavelengths of light with a penetration depth of 205-3 between $D_3$ and $D_4$ (references 215-3 and 215-4) can be detected in the photodetector layer 111-3. Component wavelengths of light with a penetration depth of 205-4 between $D_4$ and $D_5$ (references 215-4 and 215-5) can be detected in the photodetector layer 111-4. Component wavelengths of light with a penetration depth of 205-5 between $D_5$ and $D_6$ can be detected in photodetector layer 111-5. Finally, component wavelengths of light with a penetration depth of 205-6 greater than $D_6$ (reference 215-6) can be detected in the photodetector layer 111-6 or discarded as infrared noise.

As indicated in FIG. 2, photodetector layers 111-1 through 111-4 can be disposed at depths zero to $D_4$ 215 with appropriate thicknesses to capture wavelength bands in the visible spectrum. Accordingly, photodetector layers 111-1 through 111-4 can be referred to as visible photodetectors 121. Photodetector layer 111-5 can be disposed at a depth $D_5$ 215-5 corresponding to the penetration depth of the near infrared (NIR). Accordingly, photodetector layer 111-5 can be referred to herein as NIR photodetector 123. Similarly, photodetector layer 111-6 can be disposed of the depth $D_6$ corresponding to the penetration depth of infrared light (IR). As such, photodetector layer 111-6 can be referred to as IR photodetector 125.

While only six photodetector layers 111 are shown in FIG. 2, various implementations of the present disclosure can include stacks of photodetectors 111 that include more or fewer than the six layers shown. In addition, the stack of photodetectors 101 can also include photodetector layers 111 having different thicknesses and being composed of different semiconductor materials. For example, some of the photodetector layers 111 can have the same dopant type and concentration, while other photodetector layers 111 can have different dopant types and concentrations.

Implementations described herein can be formed using various standard and customized semiconductor processes, such complementary oxide semiconductor (CMOS) processes. For example, the stacked photodetector module 100, and/or its components, can be fabricated using CMOS fabrication facilities, techniques, and processes. As such, the individual photodetector layers 111 can include CMOS type photodetector devices. Various example implementations of the structures and techniques for stacked photodetector module 100 are described in further detail in reference to FIGS. 3 through 5.

Figure 3:
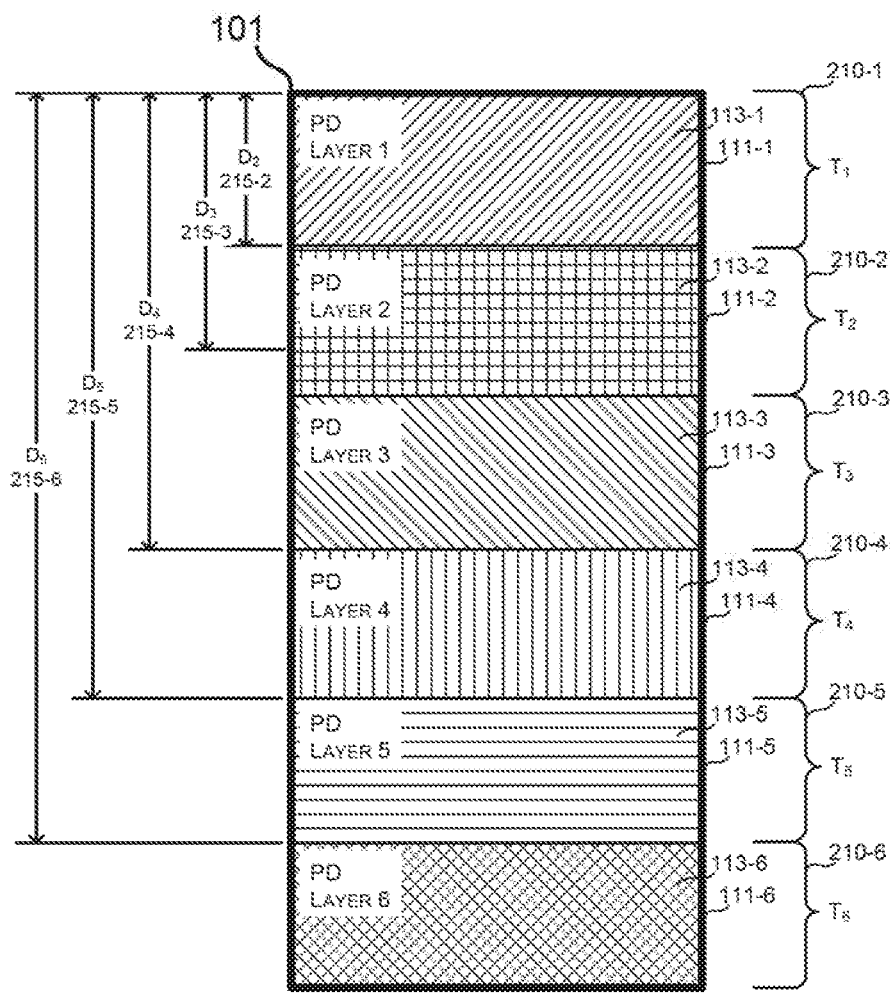
FIG. 3 illustrates an example stack of photodetectors with varying dopant types and concentrations.

FIG. 3 depicts a vertical stack of photodetectors 101 having photodetector layers 111 each comprising a different photodiode type 113. In such implementations, photodiode type 113 can include, a semiconductor material with a junction constructed by implanting different concentrations and types of dopants on either side of the layer. For example, each of the photodiode types 113 can include a P-N or PIN junction formed by varying the dopant type and/or concentration in a semiconductor material. Accordingly, each photodiode type 113 can be characterized by the dopant type and/or dopant concentration.

Selection of a photodiode type 113 can be based on the thickness T 210 of the photodetector layer 111 and/or the penetration depth ranges between depths D 215 of the desired range of wavelengths in the photodiode type 113. Accordingly, in implementations in which the thickness T 210 of each photodetector layer 111 is uniform, the range of wavelengths detected in a particular photodetector layer 111 can be tuned by selecting a photodiode type 113 with a corresponding dopant type and/or concentration. For example, to capture a wider range of wavelengths in a particular photodetector layer 111 at a particular depth D 215, a photodiode type 113 with a corresponding dopant type and/or concentration that causes the doped semiconductor material to have shallower penetration depths can be selected (e.g., a material with a higher absorption coefficient). Similarly, to capture a narrower range of wavelengths in particular photodetector layer 111, a photodiode type 113 with a corresponding dopant type and/or concentration that causes the doped semiconductor material to have deeper penetration depths can be selected (e.g., a material with a lower absorption coefficient).

Figure 4:
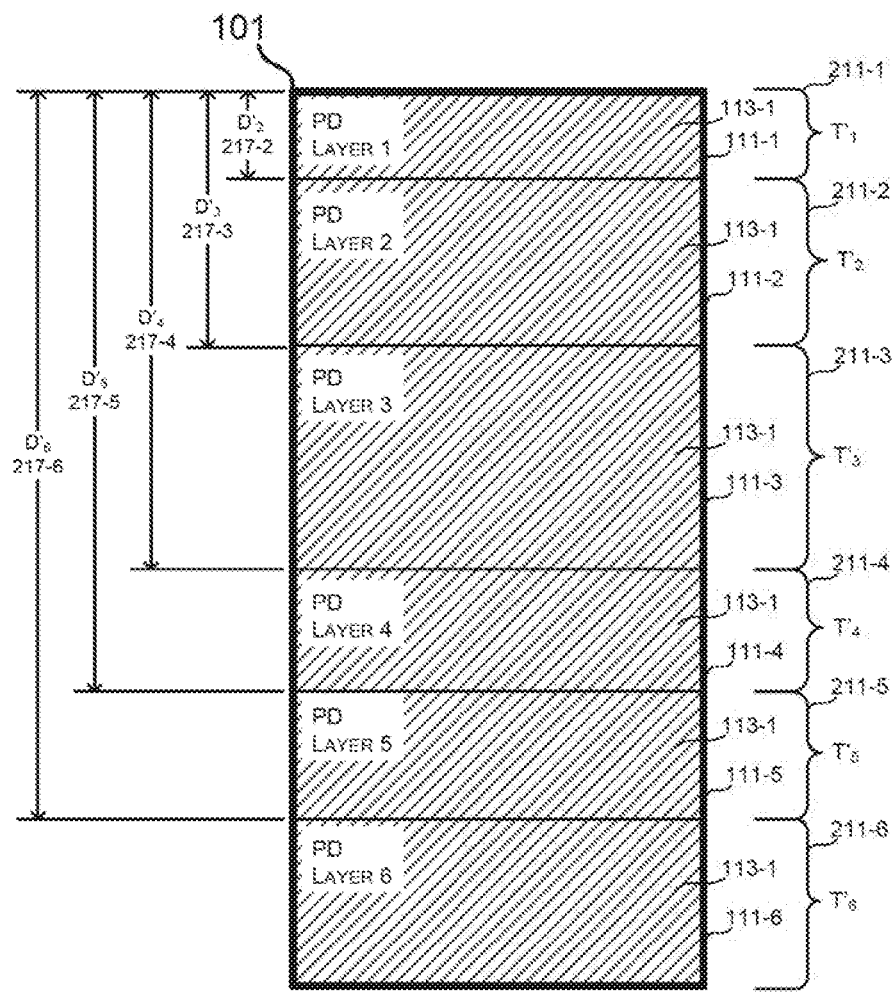
FIG. 4 illustrates an example stack of photodetectors with varying depths and thicknesses.

FIG. 4 depicts an implementation in which the photodetector type 113 of all the photodetector layers 111 is identical. In the specific example shown all the photodetector layers 111 are a particular photodiode type 113. To alter the wavelength ranges detected at each one of the photodetector layers 111, the corresponding thicknesses T' 211 and, consequently, the corresponding depths ID' 217 of deeper photodetector layers 111, can be selected.

In the example shown in FIG. 4, each photodiode detector layer 111 of photodiode type 113-1 has different thickness T' 211 selected to tune the wavelength range of light detected. Thickness $T'_1$ 211-1 of photodetector layer 111-1 can be selected to focus on a narrow band of blue light and thickness $T'_3$ 211-3 of photodetector layer 111-3 can be selected to detect a relatively wide band of yellow light. As such, each of the thicknesses T' 211 can be selected based on the lighting conditions in which the stack of photodetectors 101 is expected to be used or a desired granularity or segmentations of wavelength ranges. The thicknesses T' 211 can also be selected based on the spectral response curve of the human eye and/or an associated imaging or display device. For instance, the thicknesses T' 211 can be based on a model photometric function associated with an average of human color perception.

Figure 5:
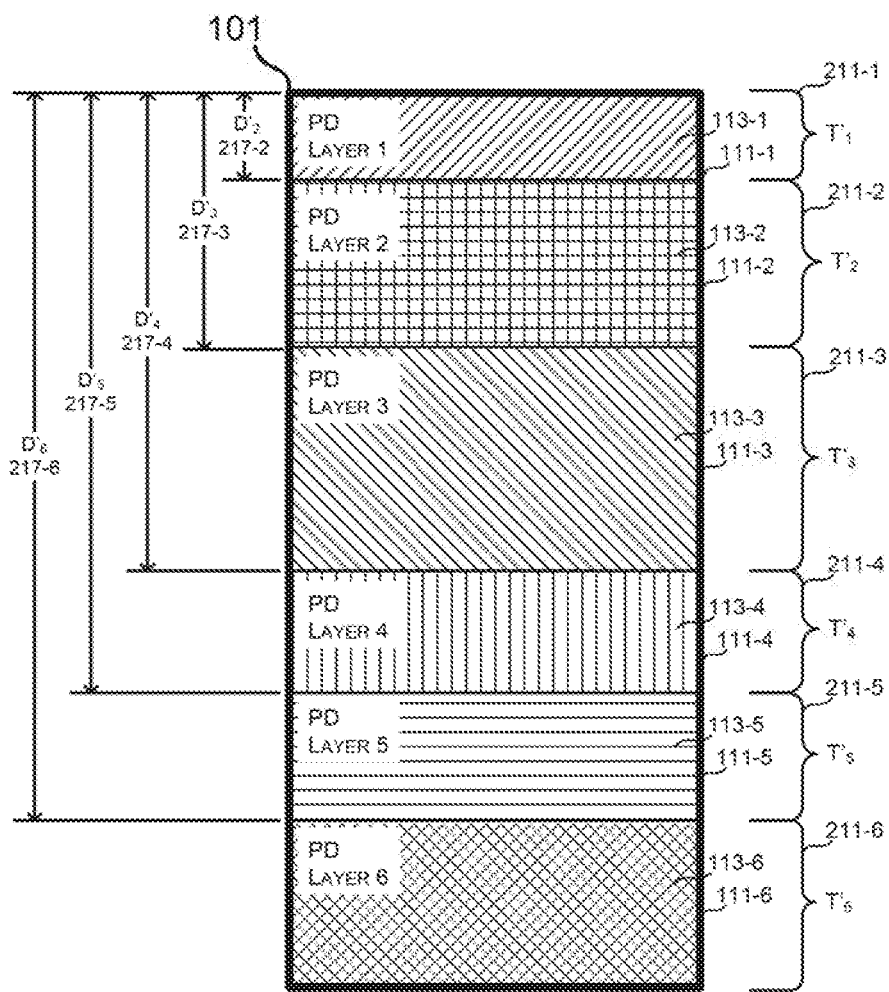
FIG. 5 illustrates an example stack of photodetectors with varying dopant types and concentrations, depths, and thicknesses.

FIG. 5 illustrates an example implementation in which each photodiode type 113 and thickness T' 211 of each photodetector layer 111 can be selected to tune the wavelength bands detected at or about each depth D' 217. Accordingly, the depth D' 217, the thickness T' 211, and the photodiode type 113 of each photodetector layer 111 can be based on the desired band of wavelengths to be detected by that photodetector 111. Furthermore, the selection of the bands of wavelengths can be based on a photometric curve, color response curves of an associated imaging device, user preferences, or the capabilities of an associated display device.

Figure 6:
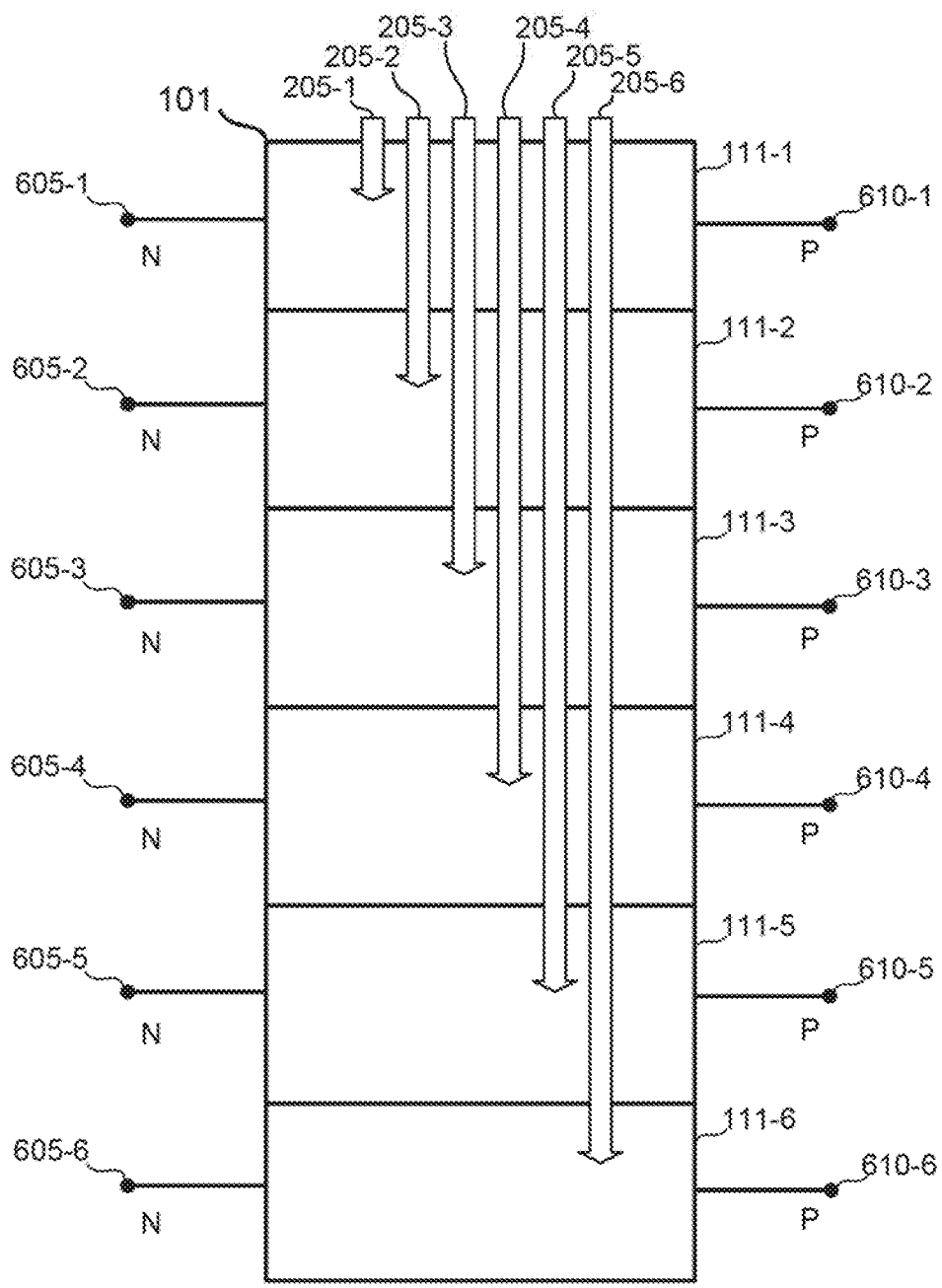
FIG. 6 depicts a schematic of P-terminals and N-terminals in an example stack of photodetectors with corresponding wavelength dependent penetration depths.

FIG. 6 depicts a schematic of an example stack of photodetectors 101. In the example shown, photodetector layers 111 of the stack of photodetectors 101 can each include corresponding N-terminals 605 and P-terminals 610. Each pair of N-terminals 605 and P-terminals 610 can be associated with a particular penetration depth 205 of a corresponding wavelength band. As such, each pair of N-terminals 605 and P-terminals 610 can be coupled to the N and P material on either side of a P-N junction in a particular photodetector layer 111. In some implementations, the P-N junction is in a horizontal orientation (e.g., the light traverses the P-N junction). In other implementations, the P-N junction is in vertical orientation (e.g., the light propagates in a direction horizontal to the P-N junction).

The P-N junction of the photodetector layer 111 can be a PN diode. For example, photodetector layer 111 can include an III-V semiconductor PN diodes, such as a GaN type diodes (e.g., AlGaN, InGaN, etc.) for visible photodetectors 121, and GaAs for NIR and IR photodetectors 123 and 125. In one example, a p-i-n (PIN) type photodiode can include a P+ region that includes AlGaAs, an undoped intrinsic region that includes i-GaAs, and an N+ region that includes AlGaAs. In another example, a PIN diode can have a P+ region that includes InAlAs, an undoped intrinsic region that includes i-InGaAs, and an N+ region that includes InGaAs.

In some implementations, N-terminals 605 and P-terminals 610 can be coupled to a bus or other input-output interface, such as external leads in an integrated circuit (IC), and controlled directly from an external controller, such as a microcontroller, microprocessor, or the like. In other implementations, the N-terminals 605 and P-terminals 610 can be coupled to the controller/interface 120 depicted in FIG. 1. As such, the stack of photodetectors 101 can be included in a modular unit (e.g., an IC device) with or without the controller/interface 120. The stack of photodetectors 101, or a modular device that includes the stack of photodetectors 101, can be integrated into a mobile computing device having an integrated imaging device and/or a display device.

Figure 7:
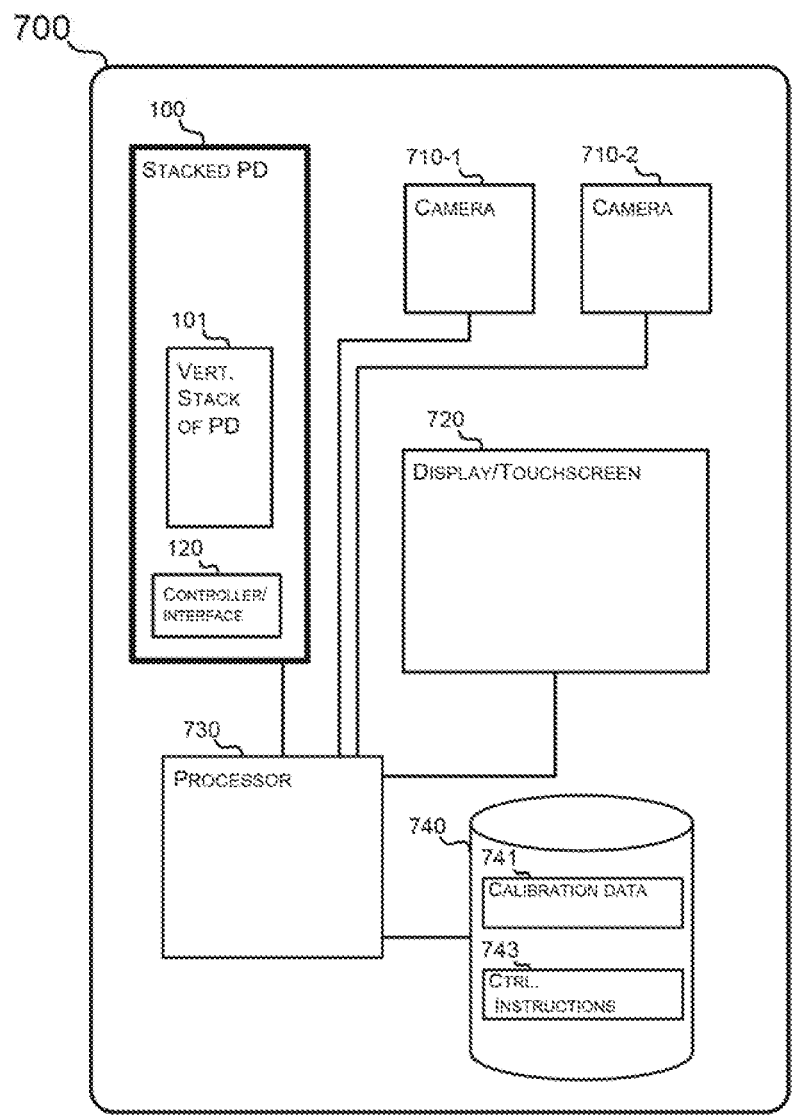
FIG. 7 depicts a schematic of a mobile computing device that includes an example stacked photodetector module.

FIG. 7 depicts an example computing device 700 that includes a stacked of photodetector module 100, according to various implementations of the present disclosure. Example computing device 700 can include any type of general-purpose or application-specific computing device, such as a tablet computer, a smart phone, an infrared imaging device, a digital camera, a video camera, and the like. In such implementations, the computing device 700 can include a general purpose processor 730 that can execute code that includes instructions for implementing various functionality and controlling the various components described herein. For example, the processor 730 can access the memory device 740 to retrieve executable instructions, operational settings, and other data to operate and control the components of the computing device 700. The memory device 740 can include any combination of a hard drive, a solid-state disk (SSD), flash memory, read-only memory (ROM), random access memory (RAM), or any other type of volatile or nonvolatile memory. Accordingly, the memory device 740 can include a non-transitory electronic storage medium for storing executable code that includes instructions for implementing the various methods, functions, and components of the example implementations described herein.

The computing device 700 can include a stacked photodetector module 100. As described herein, the stacked photodetector module 100 can include a vertical stack of photodetectors 101 and a controller/interface 120. In various implementations, the stacked photodetector module 100 can include a lens, and antireflection layer, or other light collecting element for focusing or collecting light onto an input surface of the vertical stack of photodetectors 101. In some implementations, the input surface can be varied to increase or decrease the light collecting capabilities of the vertical stack of photodetectors 101. For example, the larger the surface area of the input surface the greater the light collecting capability of the vertical stack of photodetectors 101. In related implementations, dimensions and detecting, capabilities of photodetector layers 111 can increase or decrease with the dimensions of the input surface.

The controller/interface 120 can include a dedicated processor or microcontroller and/or executable instructions for controlling the operation of the vertical stack of photodetectors 101 as described herein. Accordingly, the executable instructions can be executed using processor 730 or the controller/interface 120.

In other implementations, the controller/interface 120 can include functionality for receiving instructions or control signals from the processor 730 for controlling the operation of the vertical stack of photodetectors 101 as described herein. For example, the processor 730 can retrieve calibration data 741 from the memory 740 to generate instructions to the controller/interface 120 to set the operational parameters of the vertical stack of photodetectors 101. The calibration data 741 can include bias voltage settings associated with a particular camera module 710 and/or display/touchscreen 720. The camera module 710 can include any imaging device, such as a CMOS imager chip, a charge-coupled device (CCD) imager chip, and the like. The calibration data 741 can include other operational settings calibrated according to the performance of the vertical stack of photodetectors 101 under known light conditions during a calibration operation.

Memory 740 can also include executable code comprising control instructions 743 executable by the processor 730 for controlling the operation of the stacked photodetector module 100. The control instructions 743 can include various routines for performing various functions using the stacked photodetector module 100. For example, the control instructions 743 can include instructions for calibrating the vertical stack of photodetectors 101, instructions for performing spectral measurements (e.g., radiometric, photometric, or spectrometric measurements) of ambient light, as well instructions for generating operational settings and instructions operating for the camera module 710 or display/touchscreen module 720 based on the spectral measurements. Instructions for operating the camera module 710 can include adjustments to the color responsiveness (e.g., gain settings) of the various photodetector layer 111 (e.g., color channels). Instructions for operating the display/touchscreen module 720 can include adjustments to the brightness, color rendition, or contrast of the images or control elements displayed.

In various implementations, the controller/interface 120 can include functionality to send photoelectric signals or other information from the vertical stack of photodetectors 101 to the processor 730. For example, the controller/interface 120 can send photoelectric voltages or currents from each of the photo detector layers 111 to the processor 730. Using such photoelectric signals, the processor 730 can generate spectral content data, such as a photometric or a spectrometric curve, corresponding to the wavelength content of light incident on the vertical stack of photodetectors 101.

The processor 730 can generate, select, or adjust the operational settings of cameras 710, display/touchscreen 720, and other components of the computing device 700 based on the spectral content data. For example, the processor 730 can set the gain or integration time of the imaging device in the camera modules 710 according to the lighting conditions indicated by the spectral content data.

Figure 8:
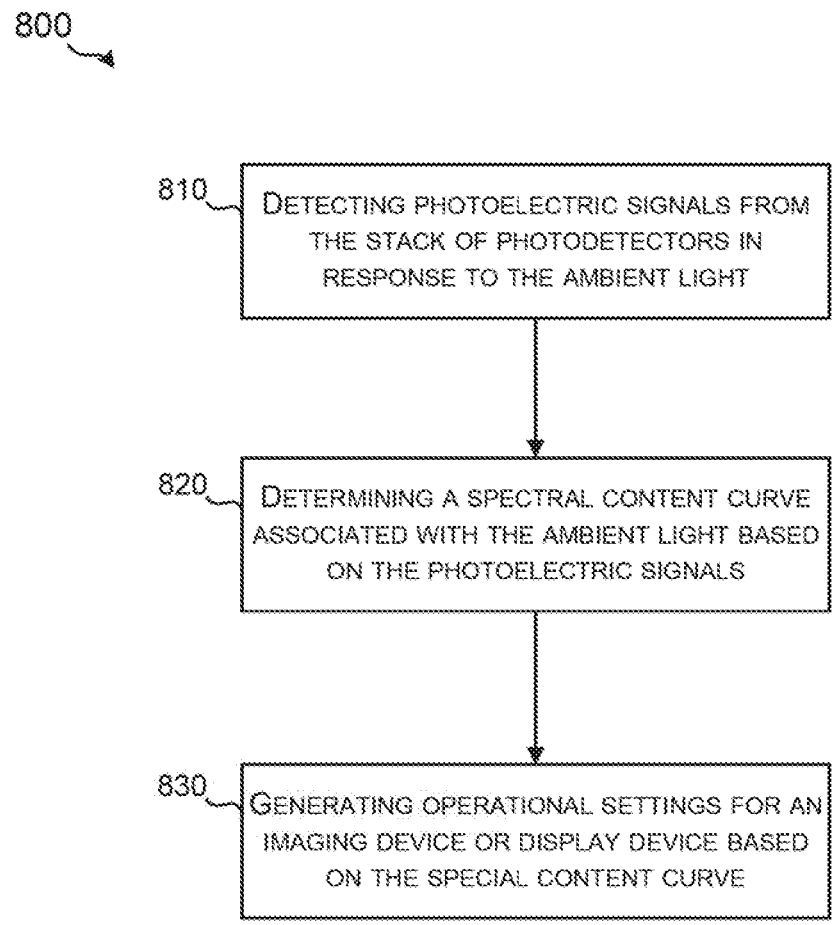
FIG. 8 is a flow chart of an example method of using a stacked photodetector to generate operational settings.

FIG. 8 is a flowchart of an example method 800 using stacked photodetector module 100, according to various implementations of the present disclosure. Method 800 can be implemented using a processor 730 executing executable control instructions 743 to control and/or operate stacked photodetector module 100, camera modules 710, and/or display/touchscreen 720. Accordingly, method 800 can be implemented in a computing device, such as computing device 700.

Method 800 can begin at box 810, in which the processor 730 can detect photoelectric signals from the stack of photodetectors 101 generated thereby in response to ambient light. As described herein, the photoelectric signals can include photoelectric currents or voltages generated in response to wavelengths of light having penetration depths corresponding to the particular positions of the photodetector layers 111 in the stack of photodetectors 101.

At box 820, the processor 730 can determine a spectral content curve associated with the ambient light based on the photoelectric signals. As described herein, the spectral content curve can include any type of radiometric, photometric, spectrometric measurements that describe the spectral content of the ambient light. In some implementations, to determine the spectral content curve, the processor 730 can reference calibration data 741 associated with the particular stack of photodetectors 101 to determine the light levels associated with a particular photoelectric signals.

At box 830, the processor 730 can generate operational settings for an imaging device or display device based on the spectral content curve. Such operational settings can include settings for white balance, sensitivity, color response, brightness, color gamut, and the like. The processor 730 can then use the operational settings for operating camera module 710 and/or the display/touchscreen 720. In such implementations, generating operational settings for the imaging device or display device can include generating an illuminance level, a chromaticity characterization, or color temperature rating for the ambient light based on the spectral content curve.

These and other variations, modifications, additions, and improvements may fall within the scope of the appended claims(s). As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:
1. A stacked photodetector comprising:
a stack of photodetector structures, each photodetector structure disposed in a position in the stack corresponding to penetration depths associated with plurality of corresponding wavelength ranges; and
a controller coupled to the stack of photodetector structures, the controller to:
determine photoelectric signals corresponding to light intensity of the wavelength ranges in light incident on the stack of photodetector structures; and apply a voltage to a photodetector structure in the stack of photodetector structures based on alighting a lighting condition.

2. The stacked photodetector of claim 1, wherein each photodetector structure in the stack of photodetector structures comprises a corresponding P-N junction.

3. The stacked photodetector of claim 1, wherein each photodetector structure in the stack of photodetector structures comprises a dopant type specific to a wavelength range in the plurality of corresponding wavelength ranges.

4. The stacked photodetector of claim 1, wherein each photodetector structure in the stack of photodetector structures comprises a corresponding dopant concentration specific to a wavelength range in the plurality of corresponding wavelength ranges.

5. The stacked photodetector of claim 1, wherein each photodetector structure is dimensioned based on the corresponding penetration depths associated with to a wavelength range in the plurality of corresponding wavelength ranges.

6. The stacked photodetector of claim 1, wherein the stack of photodetector structures comprises at least five semiconductor structures corresponding to five wavelengths ranges spanning from a near infrared wavelength to a visible blue wavelength.

7. The stacked photodetector of claim 1, wherein the controller comprises logic to generate a signal comprising the photoelectric signals and corresponding to a spectral content curve of the light incident on the stack of photodetector structures.

8. The stacked photodetector of claim 1, wherein the controller comprises logic to generate a signal comprising the photoelectric signals and corresponding to an brightness level of the light incident on the stack of photodetector structures.

9. A stacked photodetector comprising:
a plurality of complementary metal oxide semiconductor (CMOS) photodetector layers disposed in a position in a stack corresponding to penetration depths associated with plurality of corresponding wavelength ranges of light; and
a controller comprising logic to:
determine photoelectric signals from the plurality of CMOS photodetectors comprising intensity levels of the plurality of corresponding wavelength ranges in the light; and
apply a bias voltage to a CMOS photodetector layer in the stack based on ambient lighting conditions.

10. The stacked photodetector of claim 9, wherein the plurality of CMOS photodetectors comprise PN junctions parallel to an input surface of the stack.

11. The stacked photodetector of claim 9, wherein the plurality of CMOS photodetector layers comprises a plurality of photodetector layer-specific dopants types.

12. The stacked photodetector of claim 1, wherein the lighting condition includes an intensity of ambient light.

13. The stacked photodetector of claim 1, wherein the lighting condition includes a rate of change of an intensity of ambient light.

14. The stacked photodetector of claim 9, wherein the ambient lighting conditions include an intensity of ambient light.

15. The stacked photodetector of claim 9, wherein the ambient lighting conditions include a rate of change of an intensity of ambient light.

* * * * *